United States Patent [19]

Wade

[11] 4,135,168
[45] Jan. 16, 1979

[54] REVERSE CHANNEL GaAsFET OSCILLATOR

[75] Inventor: Paul C. Wade, Somerville, N.J.

[73] Assignee: Microwave Semiconductor Corporation, Somerset, N.J.

[21] Appl. No.: 874,703

[22] Filed: Feb. 2, 1978

[51] Int. Cl.² .................................... H03B 5/00
[52] U.S. Cl. ..................... 331/108 R; 331/117 R; 357/15; 357/22; 357/81
[58] Field of Search ............... 331/108 R, 111, 115, 331/116 R, 117 R, 117 D; 357/15, 22, 81

[56] References Cited

U.S. PATENT DOCUMENTS

| 3,516,021 | 6/1970 | Kohn | 331/117 R |
| 3,538,456 | 11/1970 | Contus | 331/117 D X |
| 3,995,234 | 11/1976 | Tuccinardi | 331/117 R |
| 4,015,216 | 3/1977 | Masuda | 331/8 |

OTHER PUBLICATIONS

Okazaki et al., "Microwave Oscillation with GaAs-FET", Journal of the Japan Society of Applied Physics, vol. 44, 1975, pp. 157–162.

Pucel et al., "Experiments on Integrated Gallium-Arsenide F.E.T. Oscillators at X band", Electronics Letters, vol. 11, 15 May 1975, pp. 219–220.

Primary Examiner—Siegfried H. Grimm
Attorney, Agent, or Firm—Pennie & Edmonds

[57] ABSTRACT

A common-drain high frequency power oscillator is configured by electrically reversing the channel of a GaAsFET transistor. Such an oscillator can be flip-chip mounted for reduced thermal resistance and has superior oscillation characteristics as compared with conventional common-source oscillators. Specifically, its gain is nearly constant with frequency, oscillation is less critically dependent on terminal impedance, and it can be operated with a single polarity voltage supply.

4 Claims, 5 Drawing Figures

REVERSE CHANNEL GaAsFET OSCILLATOR

BACKGROUND OF THE INVENTION

1. Field of the Invention

The present invention relates to a feedback oscillator. More particularly, it relates to a gallium arsenide field effect transistor feedback oscillator having enhanced efficiency at microwave frequencies.

2. History of the Art

Positive feedback oscillators are well-known in the art and perform a wide variety of essential electrical functions. Such an oscillator comprises, in essence, an amplifier, a frequency determining circuit, and a feedback circuit for feeding a portion of the amplifier output back in phase to the input. Typically the amplifier is a transistor amplifier, and the frequency determining network is an LC, RC or piezoelectric crystal resonant circuit proportioned to resonate at a desired frequency. Such oscillators are used in computers, communications systems, televison systems, industrial control and manufacturing processes, and even in electronic watches.

The design of high frequency power oscillators presents a number of difficult problems. At high frequencies approaching the microwave range, lead wires exhibit substantial inductive reactance, and distributed junction capacitances begin to shunt transistor output. In addition, substantial heat is generated in the transistors in high power oscillators with resulting potential deterioration of device operation and life.

Gallium arsenide field effect transistor oscillators (GaAsFET oscillators) have proven particularly useful as high power, high frequency microwave oscillators. Such oscillators typically utilize a depletion mode Schottky gate GaAs field effect transistor amplifier and a transmission line frequency determining circuit. The transistor is typically connected in a conventionally mounted common gate configuration or a flip-chip mounted common-source configuration.

While such GaAsFET oscillators have provided the highest reported frequencies among microwave devices, they nonetheless exhibit a number of limitations and non-ideal characteristics subject to improvement. For example, while the common-gate configuration has attractive oscillation characteristics, it cannot be readily flip-chip mounted to reduce thermal resistance without including the high parasitics of the heat sinking elements in the frequency determining circuit. And while the common-source configuration can be readily flip-chip mounted, it has less than ideal oscillation characteristics in that (1) the gain decreases rapidly with increasing frequency, and (2) oscillation is critically dependent upon terminal impedances. In addition, the common source configuration typically requires two power supplies of opposite polarity for operation.

Accordingly, there is a need for a GaAsFET oscillator capable of flip-chip mounting and having improved oscillation characteristics.

SUMMARY OF THE INVENTION

The present inventor has discovered that a common-drain high frequency oscillator configured by electrically reversing the channel of a GaAsFET transistor has significant advantages over the conventional common-gate and common-source oscillators. Unlike the common-gate transistor, the common-drain transistor can be flip-chip mounted for reduced thermal resistance and minimum common-lead inductance; and, as compared to common-source oscillators, the common-drain oscillator has a gain which is more nearly constant with frequency and its oscillation is less critically dependent upon terminal impedance. In addition, the common-drain oscillator can be operated with a single polarity voltage supply.

BRIEF DESCRIPTION OF THE DRAWINGS

The nature, advantages and various additional features of the invention will appear more fully upon consideration of the illustrative embodiments now to be described in detail in connection with the accompanying drawings.

In the drawings.

For convenience of reference, the same structural elements are designated by the same reference numerals throughout the drawings.

DETAILED DESCRIPTION OF THE DRAWINGS

Figure 1:
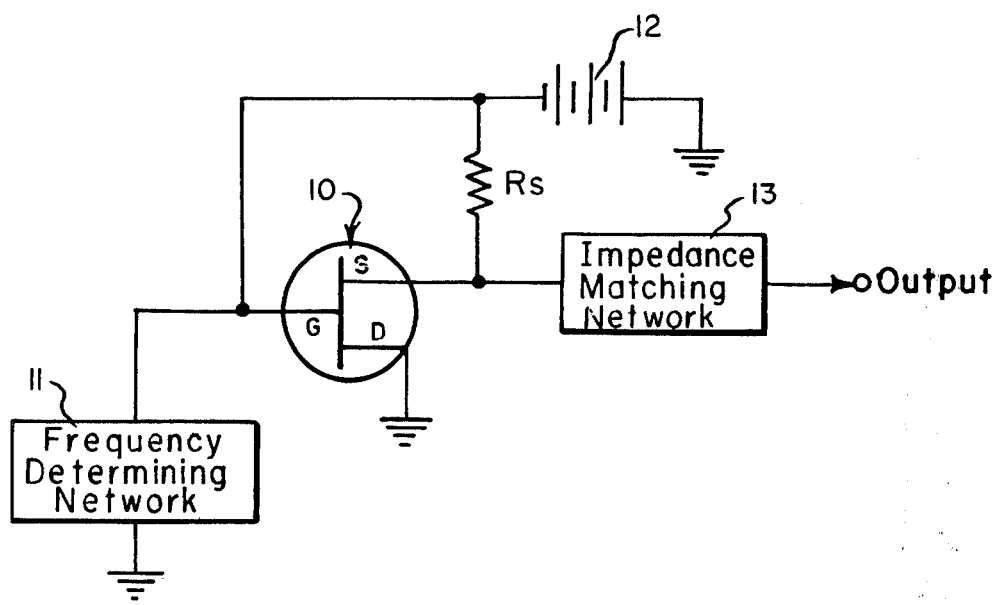
FIG. 1 is a schematic circuit diagram of a high frequency power oscillator in accordance with the invention.

Referring to the drawings, FIG. 1 is a schematic circuit diagram of a high frequency power oscillator in accordance with the invention comprising, in substance, a GaAsFET 10 connected in a common-drain configuration oscillator with positive feedback through a frequency determining network 11 and bias voltages preferably applied from a single negative power supply 12 and resistor $R_s$. Output preferably passes through impedance matching network 13.

The frequency determining network and the impedance matching network can be any of the conventional circuits well-known for these respective uses in the microwave oscillator art.

Figure 2:
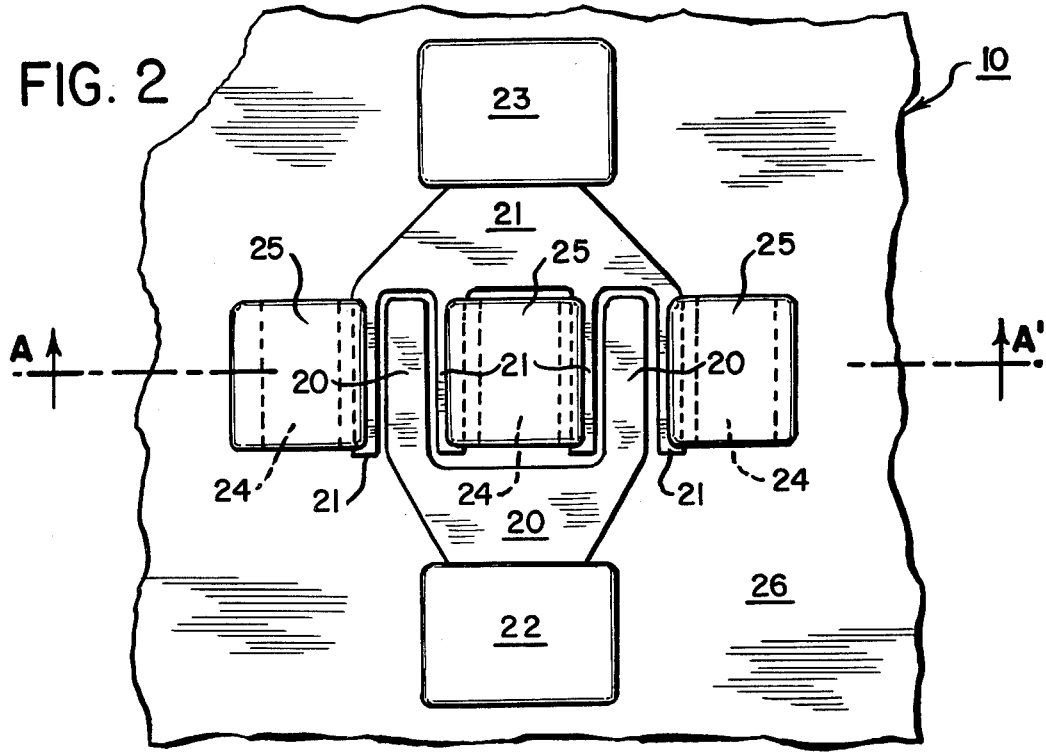
FIG. 2 is a plan view of a GaAsFET transistor used in the circuit of FIG. 1.
Figure 3:
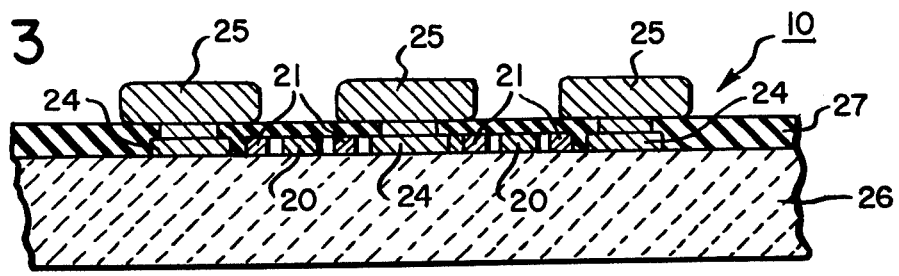
FIG. 3 is a cross-sectional view of the transistor of FIG. 2 along the line A—A'.

The GaAsFET is illustrated in greater detail in FIGS. 2 and 3. In essence, GaAsFET 10 is similar to a conventional overlay-type GaAsFET except that the source and drain contacts have been interchanged. As illustrated, the source contact electrodes 20 and gate contact electrodes 21 are interlocking finger electrode structures connected to respective source and gate bonding pads 22 and 23, respectively. A plurality of separate drain contact electrodes 24 are disposed on the sides of the gate opposite the sources and are directly connected to a respective plurality of drain bonding pads 25. The source and drain contact electrodes contact conventionally formed source and drain regions (not shown) in the GaAs substrate 26 and gate electrodes 21 are disposed above conventionally formed channels (not shown). The respective electrodes are separated by a suitable insulator 27.

Figure 4:
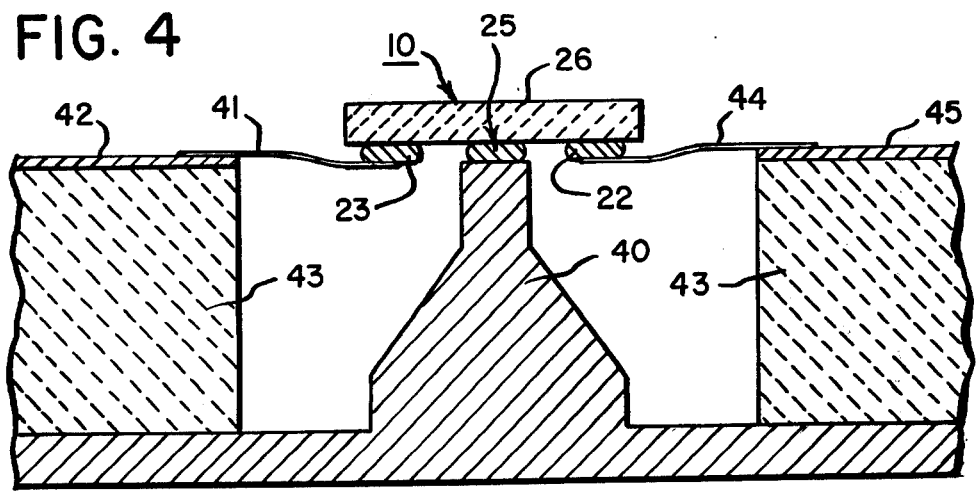
FIG. 4 is a schematic cross-sectional view showing the preferred method of mounting the transistor of FIGS. 2 and 3.

FIG. 4 illustrates the preferred mounting of GaAsFET 10 for use in oscillators in accordance with the invention. Specifically, GaAsFET 10 is flip-chip mounted with drain bonding pads 25 all bonded to a common pedestal 40 of a material such as copper having good electrical and thermal conductivity. Gate bonding pad 23 is connected by bonded lead wire 41 to a thin gold electrode 42 plated on a ceramic substrate 43, and source bonding pad 22 is connected by bonded lead wire 44 to a second gold electrode 45 plated on the ceramic. The thus mounted GaAsFET is connected to the remaining oscillator components as illustrated in FIG. 1.

Figure 5:
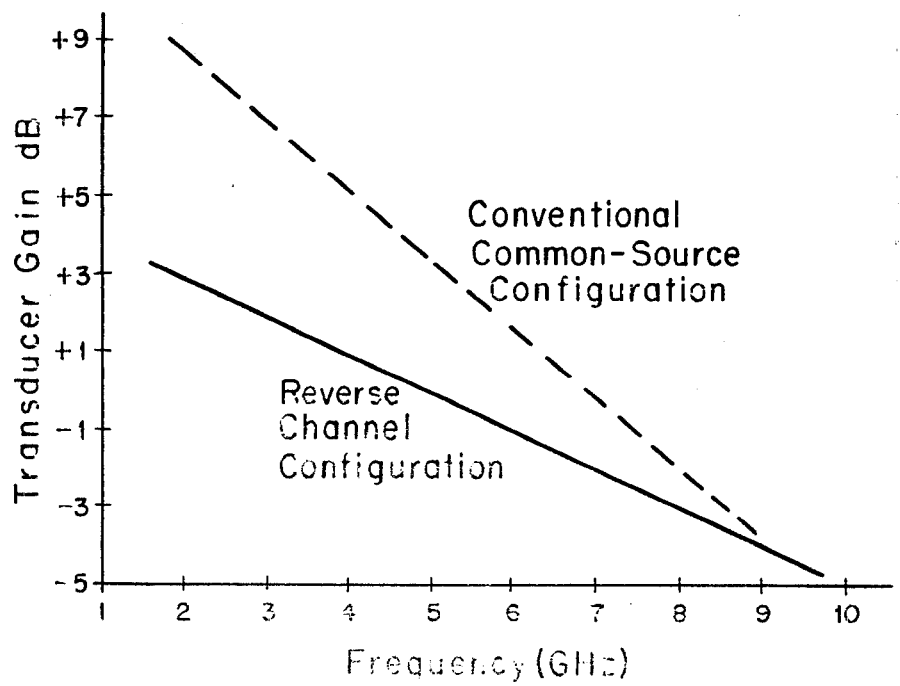
FIG. 5 is a graphical illustration of the frequency vs. gain characteristics of a typical oscillator in accordance with the invention.

The resulting oscillator has several important advantages. Pedestal 40 provides a low thermal resistance and a direct ground path with minimum common lead inductance, thus greatly reducing any tendency toward undesired low frequency oscillation. In addition, as illustrated in FIG. 5, the gain of this oscillator decreases more gradually with increasing frequency than conventional common-source oscillators, with the result that the oscillator output is more uniform over a wide frequency range. As illustrated, the oscillator can be operated with but a single polarity power supply, and has been found to be readily tunable by variation of the capacitive reactance presented at the gate.

While the invention has been described in connection with a small number of specific embodiments, it is to be understood that these are merely illustrative of the many other specific embodiments which also utilize the principles of the invention. Thus, numerous and varied devices can be made by those skilled in the art without departing from the spirit and scope of the present invention.

I claim:
1. A high frequency power oscillator comprising:
   a gallium arsenide field effect transistor having a source, a gate and a drain; a source bonding pad; a gate bonding pad; and, disposed between said source and gate bonding pads, one or more drain bonding pads;
   a conductive pedestal for contacting said one or more drain bonding pads in a flip-chip mounting arrangement;
   frequency determining means; and
   conductive means for interconnecting said source, gate and drain in a common-drain oscillator configuration.
2. An oscillator according to claim 1 wherein said transistor includes a plurality of drain bonding pads.
3. An oscillator according to claim 1 wherein said transistor includes a plurality of linearly aligned drain bonding pads.
4. An oscillator according to claim 1 wherein said transistor is an overlay-type transistor comprising interlocking source and gate finger electrode structures connected to respective source and gate bonding pads and a plurality of separate drain contact electrodes connected to a respective plurality of drain bonding pads.

* * * * *